(12) United States Patent
Heston et al.

(10) Patent No.: US 6,698,091 B1
(45) Date of Patent: Mar. 2, 2004

(54) METHOD AND APPARATUS FOR COUPLING CIRCUIT BOARDS

(75) Inventors: Matthew L. Heston, Plano, TX (US); James T. Theodoras, II, Plano, TX (US)

(73) Assignee: Cisco Technology, Inc., San Jose, CA (US)

(*) Notice: Subject to any disclaimer, the term of this patent is extended or adjusted under 35 U.S.C. 154(b) by 0 days.

(21) Appl. No.: 09/752,162

(22) Filed: Dec. 29, 2000

(51) Int. Cl.[7] .............................. H05K 3/36; B23P 19/00
(52) U.S. Cl. .............................. 29/830; 29/846; 29/845; 29/837; 29/721; 29/739; 29/759; 174/262
(58) Field of Search ........................ 29/830, 837, 842, 29/845, 739; 361/803, 790, 785, 784, 791; 324/760; 174/52.2, 264, 265

(56) References Cited

U.S. PATENT DOCUMENTS

| | | | | |
|---|---|---|---|---|
| 3,258,736 A | * | 6/1966 | Crawford | 339/252 |
| 3,904,934 A | * | 9/1975 | Martin | 317/101 D |
| 4,911,645 A | * | 3/1990 | August et al. | 439/75 |
| 4,912,401 A | * | 3/1990 | Nady, II et al. | 324/158 |
| 4,950,980 A | * | 8/1990 | Pfaff | 439/296 |
| 4,991,285 A | * | 2/1991 | Shaheen et al. | 29/830 |
| 5,049,084 A | * | 9/1991 | Bakke | 439/66 |
| 5,065,284 A | * | 11/1991 | Hernandez | 361/414 |
| 5,219,293 A | * | 6/1993 | Imamura | 439/67 |
| 5,460,531 A | * | 10/1995 | Vivio | 439/70 |
| 5,473,510 A | * | 12/1995 | Dozier, II | 361/719 |
| 5,613,033 A | * | 3/1997 | Swamy et al. | 361/790 |
| 5,672,981 A | * | 9/1997 | Fehrman | 324/760 |
| 5,715,595 A | * | 2/1998 | Kman et al. | 29/845 |
| 5,953,214 A | * | 9/1999 | Dranchak | 361/767 |
| 5,982,635 A | * | 11/1999 | Menzies et al. | 361/790 |
| 6,347,946 B1 | * | 2/2002 | Trobough et al. | 439/70 |

FOREIGN PATENT DOCUMENTS

JP  2001-250608  * 9/2001

* cited by examiner

Primary Examiner—Peter Vo
Assistant Examiner—Minh Trinh
(74) Attorney, Agent, or Firm—Campbell Stephenson Ascolese LLP

(57) ABSTRACT

A method and circuit board assembly provide a zero interconnection height in a board-to-board interconnect while maintaining efficient space allocation for multiple axis connections by providing a floating connection in one plane thereby enabling a connection in another plane. A method for interconnecting includes aligning a first circuit board having a first plurality of through-holes with a second circuit board having a second plurality of through-holes by matching the first plurality of through-holes with the second plurality of through-holes, the aligning providing an interconnection height of zero between the first circuit board and the second circuit board, aligning at least one pass-through socket with the aligned combination of the first circuit board and second circuit board, the at least one pass-through socket including pass-through socket through-holes, and inserting one or more pins disposed on a pin header through the at least one pass-through socket, the first circuit board and the second circuit board. The method further includes floating one of the first circuit board and the second circuit board prior to inserting the pin header, the floating enabling the first circuit board to interconnect with the second circuit board with a connector aligned along an axis different from the pin header.

16 Claims, 4 Drawing Sheets

METHOD AND APPARATUS FOR COUPLING CIRCUIT BOARDS

BACKGROUND OF THE INVENTION

1. Field of the Invention

The present invention relates to an apparatus achieving a high density, zero-height board-to-board interconnect, and, more particularly to an apparatus suited for optical and electrical interconnections.

2. Description of the Related Art

Modern electronic equipment widely employ electrical connectors. Often, electrical connectors are utilized for coupling printed circuit boards together. One typical use of a connector is for connecting main circuit boards, or mother boards to other circuit boards, or "daughter boards."

Typically, mother board connectors include a "card edge" including housing with rows of conductive contacts within a slot for receiving a daughter board with contact pads. Mother board connectors typically include spring biased conductive contacts for maintaining electrical contact with the daughter board. Other types of contacts for mating mother boards to daughter boards include fork and blade contacts, and pin and receptacle contacts. Also known are flexible circuits for connecting points on a printed circuit board. Flexible circuits include conductive traces disposed on a flexible substrate with pressure mounted connectors for making contact between printed circuit boards.

When making connections between printed circuit boards, the considerations for determining the type of connector include the interconnection height, required signal density and the amount of mechanical float. Typically, connections between printed circuit boards occur in only a single axis due to the mating connectors's requirement to be displaced during interconnection. When additional axes of connection are required, connectors must be made to float, flex or rotate. For example, a printed circuit board with two axes requiring connections typically must have one or both connectors with the ability to float, flex or rotate into position. The mechanical difficulties in the typical two axis connector results in a limited number of signals. Attempts at employing flexible circuits have proved disadvantageous due to the decreased signal density and decreased reliability of flexible circuits. Further, flexible circuits typically bend in only one dimension.

The problems of connecting in multiple dimensions is compounded for circuit board interconnections of optics modules to mother boards. More particularly, optics modules require both electrical and optical interconnections to be mated, but with different displacements and different axes. Typically, optical connectors require large displacements during the mating of the connectors and in a different axis than the electrical connectors. As a result, the prior art teaches a board-to-board electrical connector with a discrete connection height for the electrical connection in tandem with optical connectors on loose fiber "pigtails" for optical connections. However the "pigtails" for optical connections present problems of signal density and reliability. In typical board-to-board interconnections, the electrical connectors present problems with distance between the circuit boards in space-limited applications.

What is needed is a connection mechanism that allows electrical and optical connections to be made on a single module with zero height between the module and the mother board. Additionally, what is needed is a connection mechanism that allows multiple axis connections.

SUMMARY OF THE INVENTION

Accordingly, a method and circuit board assembly provide a zero interconnection height in a board-to-board interconnect while maintaining efficient space allocation for multiple axis connections by providing a floating connection in one plane thereby enabling a connection in another plane. More specifically, a method for interconnecting includes aligning a first circuit board having a first plurality of through-holes with a second circuit board having a second plurality of through-holes by matching the first plurality of through-holes with the second plurality of through-holes, the aligning providing an interconnection height of zero between the first circuit board and the second circuit board, aligning at least one pass-through socket with the aligned combination of the first circuit board and second circuit board, the at least one pass-through socket including pass-through socket through-holes, and inserting one or more pins disposed on a pin header through the at least one pass-through socket, the first circuit board and the second circuit board.

The method further includes floating one of the first circuit board and the second circuit board prior to inserting the pin header, the floating enabling the first circuit board to interconnect with the second circuit board with a connector aligned along an axis different from the pin header. In one embodiment the connector is an optical connector, and one of the first circuit board and the second circuit board is an OC-X transmit module, such as an OC-192 transmit module, disposed in a synchronous optical network (SONET) communication system.

A method for interconnecting a first circuit board in multiple axes of connection includes connecting the first circuit board to a second circuit board in a first axis, the connecting fixing the relative positions of the first circuit board and the second circuit board in one plane, aligning the first circuit board having a first plurality of through-holes with the second circuit board having a second plurality of through-holes by floating the first circuit board in another plane to match the first plurality of through-holes with the second plurality of through-holes, the aligning providing an interconnection height of zero between the first circuit board and the second circuit board, aligning at least one pass-through socket with the aligned combination of the first circuit board and second circuit board, the at least one pass-through socket including pass-through socket through-holes, and inserting one or more pins disposed on a pin header through the at least one pass-through socket, the first circuit board and the second circuit board.

Another embodiment of the present invention is directed to a circuit board assembly. The circuit board assembly includes a mother board having a first plurality of through-holes, a daughter board having a second plurality of through-holes, the daughter board disposed with zero interconnection height relative to the mother board, at least one pass-through socket coupled to the combination of the mother board and the daughter board, the at least one pass-through socket disposed on an exterior side of the combination of the mother board and the daughter board, and a pin header having one or more pins, the one more pins insertable through the at least one pass-through socket and the combination of the mother board and the daughter board via the first and second pluralities of through holes, the one or more pins making electrical contact to signal contacts disposed in the mother board and the daughter board when the one or more pins are inserted.

In one embodiment, electrical contact with the one or more pins is maintained by spring force of signal contacts in the through holes. In another embodiment, the daughter board is connected via a connector, the connection fixing the daughter board and the mother board in a first plane, the daughter board floating in a second plane prior to the insertion of the one or more pins through the at least one pass-through socket and the combination of the mother board and the daughter board. In another embodiment, the daughter board floats relative to the mother board prior to the insertion of the one or more pins of the pin header, the float enabling the daughter board to interconnect with the mother board with a connector, such as an optical connector, aligned along an axis different from the axis in the direction of the one or more pins of the pin header.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise indicated.

DETAILED DESCRIPTION OF THE INVENTION

The following is intended to provide a detailed description of an example of the invention and should not be taken to be limiting of the invention itself. Rather, any number of variations may fall within the scope of the invention that is defined in the claims following the description.

Figure 1:
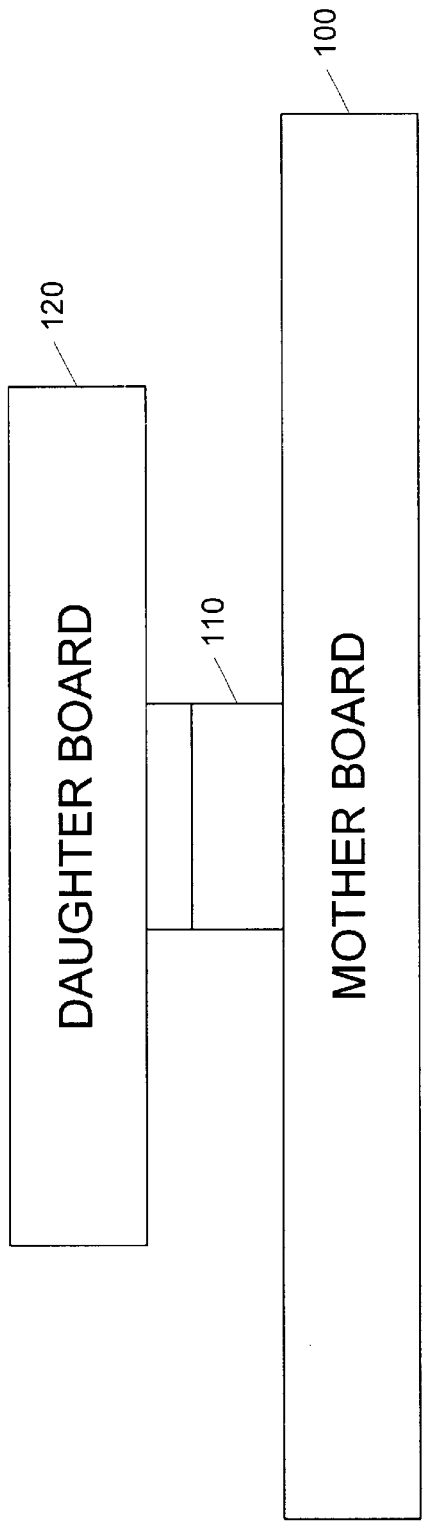
FIG. 1, designated prior art, is a schematic representation of a typical board-to-board interconnection.

Referring now to FIG. 1, labeled "prior art," a conventional connector 110 is shown disposed in a board-to-board configuration between a daughter board 120 and a mother board 100. As shown, the conventional connection 110 causes a height between the daughter board 120 and the mother board 110. Such a height is undesirable in many applications for which space is restricted or costly.

Figure 2:
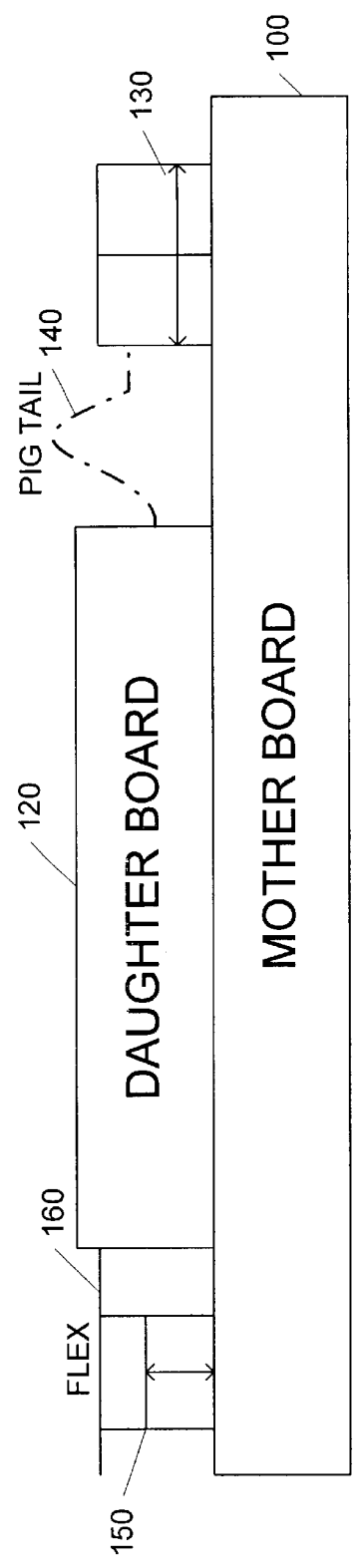
FIG. 2, designated prior art, is a schematic representation of a board-to-board interconnection showing a two axis connection.

FIG. 2, also labeled "prior art" shows a second board-to-board configuration that achieves a zero height displacement between the daughter board 120 and the mother board 100. As shown, however, the mechanism achieves the zero height displacement by having the connectors on the mother board 100 at distances from the daughter board 120. FIG. 2 demonstrates coupling between mother board 100 and daughter board 120 via a "pig tail" 140 of, for example, fiber optic cabling, coupling to connector 130. Further coupling between mother board 100 and daughter board 120 is shown via a flexible circuit 160 coupling connector 150. FIG. 2 demonstrates the prior art of requiring additional space and connectors to allow flush board-to-board connections, i.e., with zero interconnection height.

Figure 3:
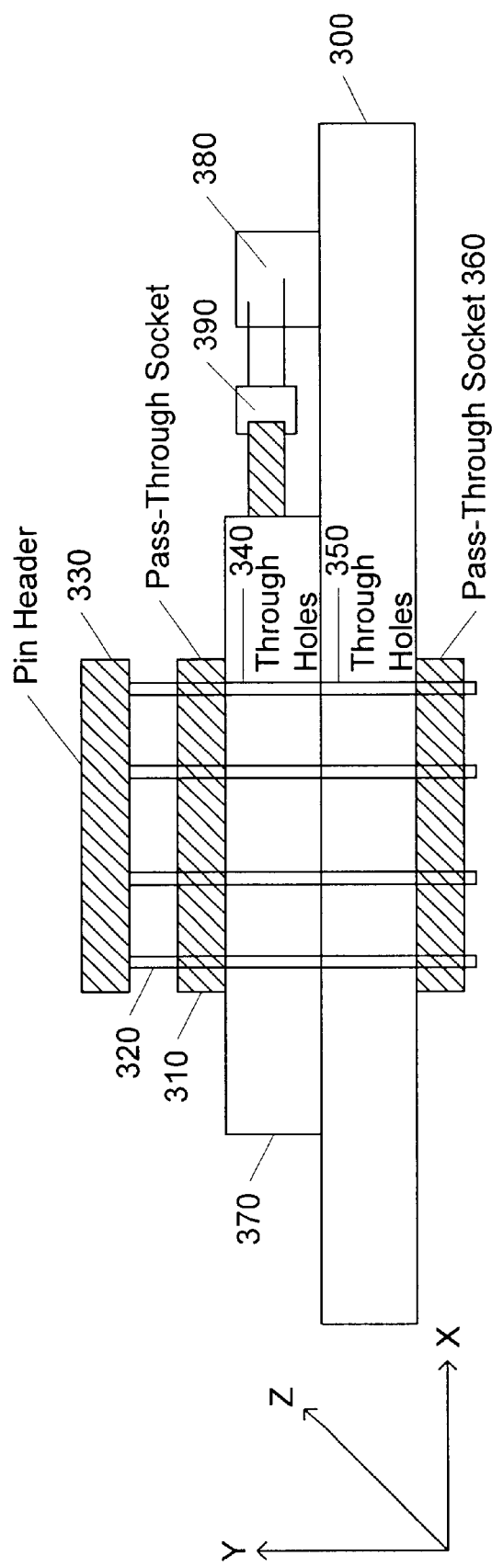
FIG. 3 is a schematic representation of a connection mechanism in accordance with an embodiment of the present invention.

Referring now to FIG. 3, a side view of a board-to-board interconnection in accordance with an embodiment is shown. FIG. 3 includes a mother board 300 with a plurality of through holes 350 disposed therethrough. A daughter board 370 is shown disposed flush with the mother board 300 with a zero interconnection height. Within daughter board 370 is a plurality of through holes 340 aligned with the through holes 350 shown in the mother board 300. On either side of the combined circuit boards, the daughter board 370 and the mother board 300, are pass through sockets 310 and 360. As one skilled in the art appreciates, the term "pass-through socket" is additionally referred to as "pass through connector" and "bottom entry connector." The embodiment shown includes pass-through sockets on each side of the combined circuit boards, however, one of skill in the art appreciates that other embodiments alternatively include one pass-through socket in other architectures. For example, a mother board with a built in socket is within the scope of the present invention.

FIG. 3 further includes a pin header 330 with one or more pins adhered thereto. The number and spacings of the pins on the pin header 330 can vary according to the needs of a system designer. In one embodiment, for example, the pin header holds at least 40 pins on a two millimeter grid.

Figure 4:
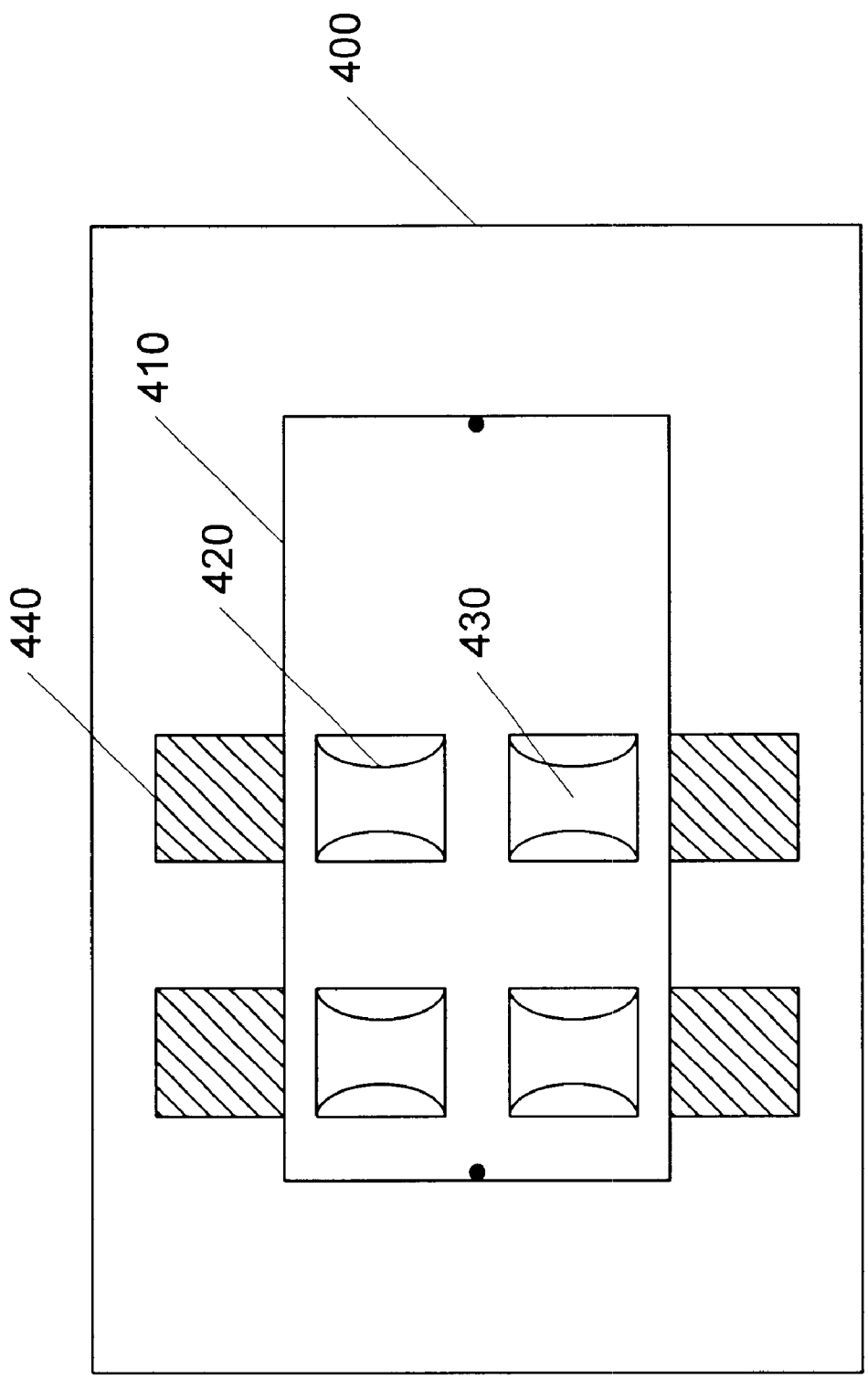
FIG. 4 is a top view of a board-to-board interconnection illustrating a plurality of through-holes in accordance with an embodiment of the present invention.

The through-holes disposed in the mother board 300 and the daughter board 370 include spring contacts according to one embodiment. Referring to FIG. 4, the spring contacts 420 as shown within the through holes 430 of a daughter board 410. As shown, a mother board 400 also includes a plurality of through holes 440 also including spring contacts.

Figure 5:
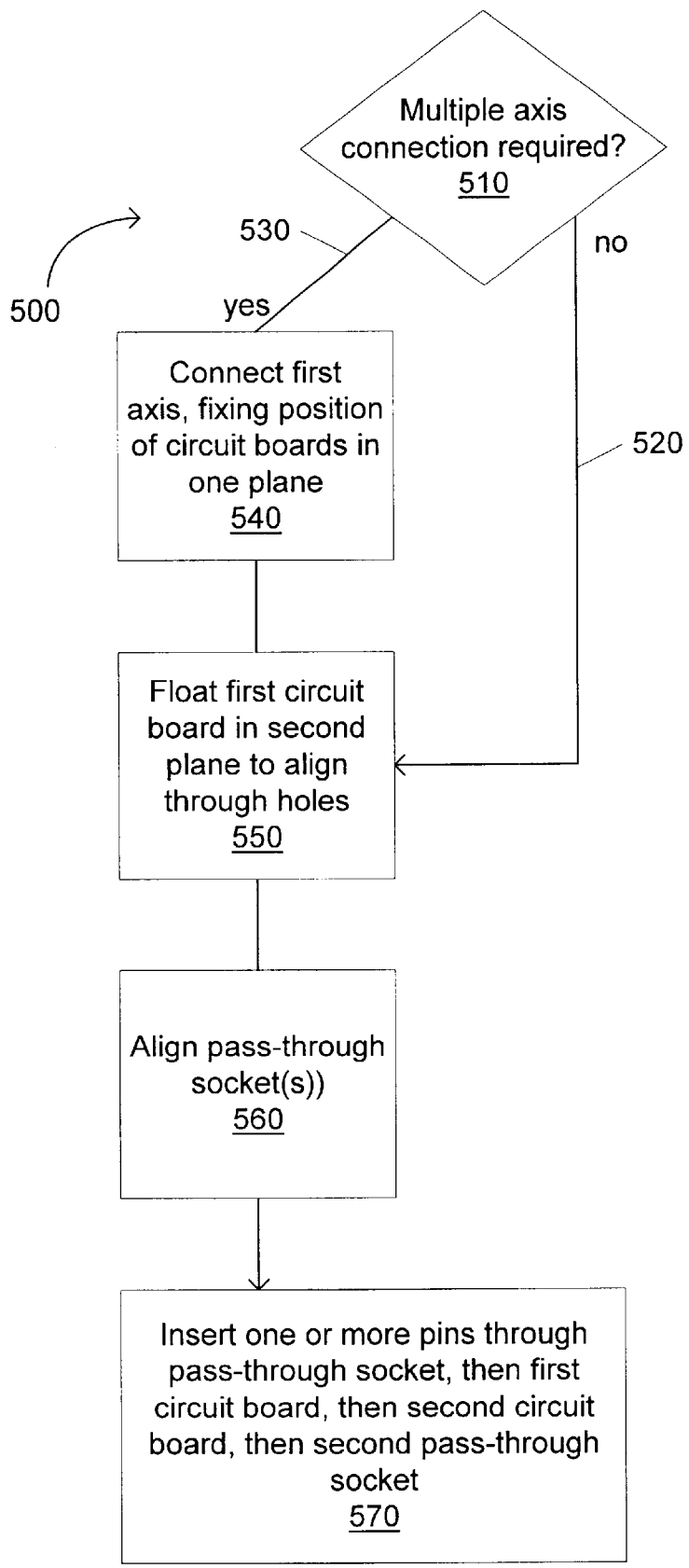
FIG. 5 is a flow diagram showing a method in accordance with an embodiment of the present invention.

Referring now to FIG. 5, a method of interconnecting circuit boards is provided in a flow diagram. FIG. 5, with reference to FIG. 3 describes how to implement the method 500. Block 510 asks whether a multiple axis connection is required. If a multiple axis connection is required, according to an embodiment, a first axis connection is performed in block 540 to fix the position of the circuit boards along a first plane. Referring to FIG. 3, optics connector 390, which is located on the daughter board, couples the daughter board 370 to its mate 380, located on the mother board 300. The connection allows optic signals to transmit in a horizontal axis when connected. Further, the connection fixes the relationship between the mother board 300 and the daughter board 370 along at least a first plane. Referring to FIG. 3, in one embodiment the connection between optics connection 390 and 380 in a three dimensional view, fixes the relationship in an X-Y plane, and a Y-Z plane but not in an X-Z plane. Thus, the daughter board floats relative to the mother board for alignment purposes in the Z direction to assist later connecting with the pin header 330.

In one embodiment, optics connector 390, is part of the daughter board 370 and its mate is located on the mother board 300, which is an optics module, such as an OC-192 transmit module used in a synchronous optical network (SONET) system. Thus, optics circuitry 380, in one embodiment is part of mother board 300. Such optics modules typically require different electrical and optical interconnections in different axes to be mated. Further, optical connectors typically require large displacements during mating before they snap shut.

Referring back to FIG. 5, after the first plane is fixed, block 550 provides that the first circuit board can be floated in a second plane to align through holes in the first circuit board and the second circuit board. Referring to FIG. 3, the second plane is an X-Z plane, along which the through holes of the daughter board 370 and the mother board 300 can be aligned. If a multiple axis connection is not required, block 510 directs the method via 520 to begin with floating the first circuit board to align the through holes of both circuit boards in block 550. Block 550 is illustrated in FIG. 3 with the mother board 300 in alignment with the daughter board 370.

Block 560 provides that a further aligning take place in aligning one or more pass-through sockets with the aligned mother board 300 and daughter board 370. Block 570 provides for inserting one or more pins disposed on a pin header through the pass-through socket, through the first circuit board, through the second circuit board and then through a second pass-through socket. FIG. 3 illustrates the block by showing pins 320 being inserted through the pass-through socket 310, the daughter board 370, the mother board 300 and a lower pass-through socket 360. Once the pins are inserted, an electrical connection is established that transmits in a vertical direction.

While particular embodiments of the present invention have been shown and described, it will be obvious to those skilled in the art that, based upon the teachings herein, changes and modifications may be made without departing from this invention and its broader aspects and, therefore, the appended claims are to encompass within their scope all such changes and modifications as are within the true spirit and scope of this invention.

What is claimed is:

1. A method for interconnecting comprising:
    aligning a first circuit board having a first plurality of through-holes with a second circuit board having a second plurality of through-holes by matching the first plurality of through-holes with the second plurality of through-holes, the aligning providing an interconnection height of zero between the first circuit board and the second circuit board, the aligning a first circuit board resulting in an aligned combination of the first circuit board and the second circuit board;
    aligning at least one pass-through socket with the aligned combination of the first circuit board and second circuit board, the at least one pass-through socket including pass-through socket through-holes;
    inserting one or more pins disposed on a pin header through the at least one pass-through socket, the first circuit board and the second circuit board ; and
    floating one of the first circuit board and the second circuit board prior to inserting the pin header, the floating enabling the first circuit board to interconnect with the second circuit board with a connector aligned along an axis other than a vertical axis of the pin header.

2. The method of claim 1 wherein the pin header includes a plurality of pins for passing through the at least one pass-through socket through-holes, the first plurality of through-holes and the second plurality of through-holes.

3. The method of claim 1 wherein:
    the at least one pass-through socket includes a first pass-through socket and a second pass through socket; and
    the aligning at least one pass-through socket includes aligning the first pass-through socket such that the first pass-through socket is disposed on one side of the aligned combination of the first circuit board and second circuit board and the second pass-through socket is disposed on an opposing side of the aligned combination.

4. The method of claim 1 wherein the connector is an optical connector.

5. The method of claim 1 wherein the first circuit board is a daughter board and the second circuit board is a mother board.

6. The method of claim 1 wherein the first circuit board is an OC-192 transmit module disposed in a synchronous optical network (SONET) communication system.

7. A method for interconnecting a first circuit board in multiple axes of connection comprising:
    connecting the first circuit board to a second circuit board in a horizontal axis, the connecting fixing the relative positions of the first circuit board and the second circuit board in one plane;
    aligning the first circuit board having a first plurality of through-holes with the second circuit board having a second plurality of through-holes by floating the first circuit board in another plane to match the first plurality of through-holes with the second plurality of through-holes, the aligning providing an interconnection height of zero between the first circuit board and the second circuit board, the aligning a first circuit board resulting in an aligned combination of the first circuit board and the second circuit board;
    aligning at least one pass-through socket with the aligned combination of the first circuit board and second circuit board, the at least one pass-through socket including pass-through socket through-holes; and
    inserting one or more pins disposed on a pin header through the at least one pass-through socket, the first circuit board and the second circuit board, wherein the pins are perpendicular to the horizontal axis.

8. The method of claim 7 wherein the pin header includes a plurality of pins for passing through the at least one pass-through socket through-holes, the first plurality of through-holes and the second plurality of through-holes.

9. The method of claim 7 wherein:
    the at least one pass-through socket includes a first pass-through socket and a second pass through socket; and
    the aligning at least one pass-through socket includes aligning the first pass-through socket such that the first pass-through socket is disposed on one side of the aligned combination of the first circuit board and second circuit board and the second pass-through socket is disposed on an opposing side of the aligned combination.

10. The method of claim 7 wherein the first circuit board is a daughter board and the second circuit board is a mother board.

11. The method of claim 7 wherein the first circuit board is an OC-192 transmit module disposed in a synchronous optical network (SONET) communication system.

12. An apparatus for interconnecting a first circuit board in multiple axes of connection, the apparatus comprising:
    means for connecting the first circuit board to a second circuit board in a horizontal axis, the connecting fixing the relative positions of the first circuit board and the second circuit board in one plane;
    means for aligning the first circuit board having a first plurality of through-holes with the second circuit board having a second plurality of through-holes by floating the first circuit board in another plane to match the first plurality of through-holes with the second plurality of through-holes, the aligning providing an interconnection height of zero between the first circuit board and the second circuit board, the aligning a first circuit board resulting in an aligned combination of the first circuit board and the second circuit board;
    means for aligning at least one pass-through socket with the aligned combination of the first circuit board and second circuit board, the at least one pass-through socket including pass-through socket through-holes; and means for inserting one or more pins disposed on a pin header through the at least one pass-through socket, the first circuit board and the second circuit board.

13. The apparatus of claim 12 wherein the pin header includes a plurality of pins for passing through the at least one pass-through socket through-holes, the first plurality of through-holes and the second plurality of through-holes.

14. The apparatus of claim 12 wherein the means for aligning the first circuit board includes a means for aligning a first pass-through socket and a second pass-through socket such that the first pass-through socket is disposed on one side of the aligned combination of the first circuit board and second circuit board and the second pass-through socket is disposed on an opposing side of the aligned combination.

15. The apparatus of claim 12 wherein the first circuit board is a daughter board and the second circuit board is a mother board.

16. The apparatus of claim 12 wherein the first circuit board is an OC-192 transmit module disposed in a synchronous optical network (SONET) communication system.

* * * * *